United States Patent [19]

McBride

[11] Patent Number: 4,803,433

[45] Date of Patent: Feb. 7, 1989

[54] METHOD AND APPARATUS FOR SHIMMING TUBULAR SUPERMAGNETS

[75] Inventor: John J. McBride, Gibsonia, Pa.

[73] Assignee: Montefiore Hospital Association of Western Pennsylvania, Inc., Pittsburgh, Pa.

[21] Appl. No.: 136,201

[22] Filed: Dec. 21, 1987

[51] Int. Cl.[4] ............................................. G01R 33/20
[52] U.S. Cl. ................................... 324/318; 335/298
[58] Field of Search ............... 335/211, 214, 296, 297, 335/298, 301, 304; 324/318, 319, 320, 322, 309, 300

[56] References Cited

U.S. PATENT DOCUMENTS 4,629,989  12/1986  Riehl ................................... 324/318
4,698,611  10/1987  Vermilyea ........................... 335/298

Primary Examiner—Michael J. Tokar
Attorney, Agent, or Firm—Harry B. Keck

[57] ABSTRACT

A method and apparatus is provided for quickly shimming a tubular supermagnet to function in several different environments which create unique impurity gradients to interfere with uniformity of the electromagnetic field from the supermagnet. Non-magnetic tubes are secured to the supermagnet casing for receiving non-magnetic shim supporting rails. The shim supporting rails carry magnetic material masses, usually steel, for precise location on the periphery of the supermagnet casing. Holes may be cut into the supermagnet shroud for introducing and withdrawing the shim support rails. Arcuate aesthetic covers for the shroud holes are provided to restore the aesthetic appearance of the shroud.

12 Claims, 3 Drawing Sheets

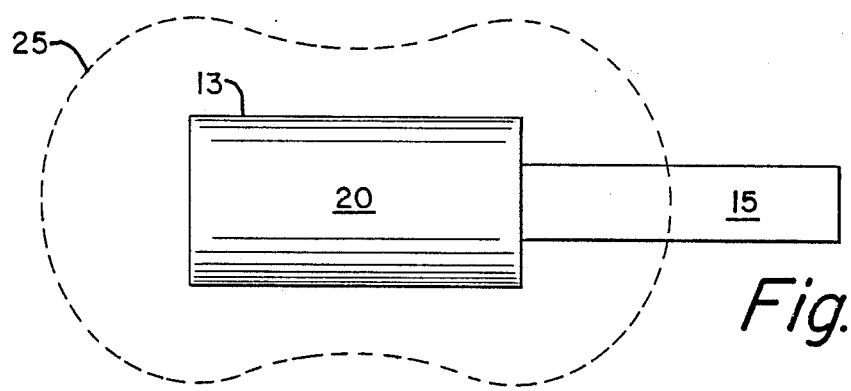
Fig. 3
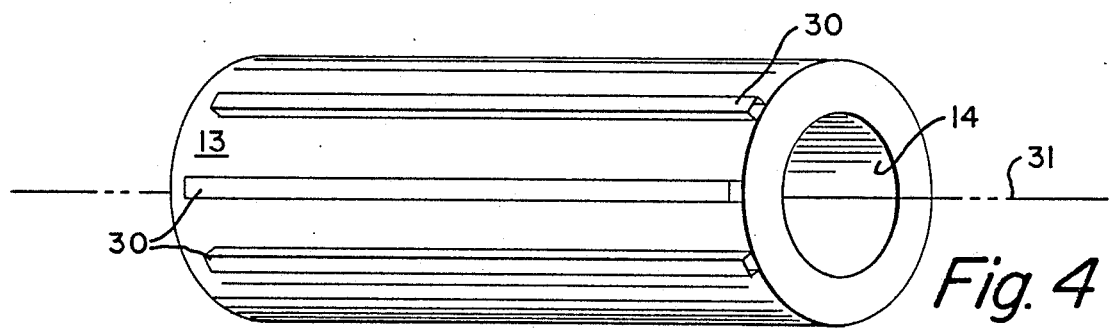
Fig. 4
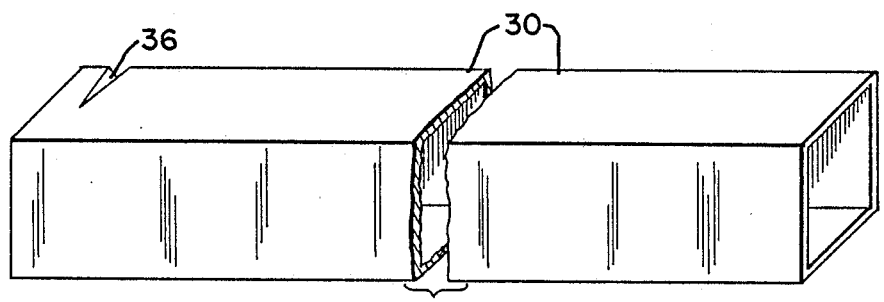
Fig. 5
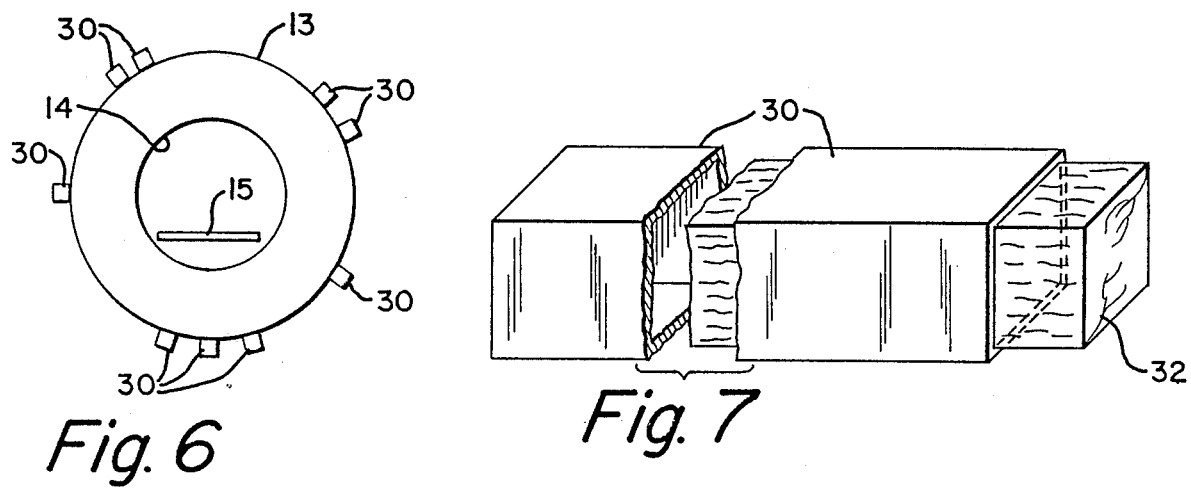
Fig. 6
Fig. 7

METHOD AND APPARATUS FOR SHIMMING TUBULAR SUPERMAGNETS

BACKGROUND OF THE INVENTION

1. Field of the Invention

The present invention relates to an improved method and apparatus for shimming a tubular supermagnetic of the type employed in magnetic resonance imaging equipment.

2. Description of the Prior Art

Magnetic resonance imaging (MRI) equipment is gaining acceptance as a medical diagnostic procedure which is non-invasive and does not employ hazardous forms of radiation such as X-ray. In MRI installations, a patient is positioned in the center of a tubular supermagnet. The individual's unique anatomical characteristics can be recorded and visually presented. It is important that the electromagnetic field of the supermagnet be reasonably uniform and free of discontinuities or irregularities in the electromagnetic field. Such irregularities are known as "impurity gradients". The impurity gradients usually are the result of magnetic metal masses in proximity to the supermagnet, for example, structural columns, beams, girders and panels in the building which contains the MRI unit or which is adjacent to the MRI unit, particularly where the MRI unit is mounted on a mobile trailer. The shimming corrections can be carried out in a site-specific manner by positioning appropriate masses of magnetic material (usually steel) at selected locations on the cylindrical surface of the casing in which the tubular supermagnet is mounted. The cylindrical casing normally is mounted within a housing which provides only limited annular space between the casing and the housing. During the shimming operation it is necessary that a technician crawl into the annular space to secure the appropriate magnetic masses on the cylindrical surface of the casing at the required locations. If the shimming is properly carried out, the supermagnet will be effectively compensated so long as the unit remains at the existing site and so long as the peripheral magnetic metal (beams, columns, girders, panels) causing impurity gradients are not altered.

Because of the initial expense and operating costs of MRI units, there is a need to share the use of the units, e.g., by using one MRI unit at different locations. Mobile MRI units are available to satisfy this need. Mobile units are mounted on trailers together with the accompanying computing equipment, power generators, liquified gas cooling systems, et cetera. Each specific location of the trailer presents a different site with unique impurity gradients requiring unique shimming procedures. The shimming materials applied in a prior location should be removed before the shimming is carried out at the new location. Any individual original shimming activity requires several days of on site intensive activity by highly skilled technicians.

The need to establish and re-establish the unique shimming at each location interferes with the desired mobility of a costly MRI serving a number of operating locations.

STATEMENT OF THE PRESENT INVENTION

The site-specific shimming of a tubular supermagnet can be carried out reproducibly in a short time without requiring operating personnel to enter into the annular space between the supermagnet and the housing. Non-magnetic tubes are secured to the periphery of the supermagnet casing generally parallel to the longitudinal axis of the tubular supermagnet. The tubes are positioned at those locations where pre-existing shimming activities have locate masses of magnetic material, usually steel bars, rods or plates, to accomplish the required shimming. A shim supporting rail is provided for each of the tubes. The tubes are preferably rectangular or square in cross-section and are fabricated from aluminum tubing or plastic tubing such as extrudable structural plastics or fiber-reinforced plastics. The required mass of magnetic material (steel) is secured to a rail at the appropriate position or positions along said rail to achieve the pre-established shimming corrections. The magnetic material may be in the form of rods, plates, sheets or bars and may be secured to the rails by means of adhesives, fasteners such as screws or nails (and preferably non-magnetic screws or nails), or by means of tape, rope, cord, wire or other fastening materials. The non-magnetic rail is preferably a wooden rail although other non-magnetic materials such as aluminum or other plastics may be employed. Each individual rail is introduced into its unique tube and is advanced to the end of the tube where an appropriate stop member is provided to assure that each rail with its supported magnetic material mass is properly positioned. The stop member may be a closed end of the tube or may be any device such as a nail or a deformation in the wall of the tube or a penetrating element such as a bolt or other obstruction.

Each of the shim-supporting rails is provided with a visible indicator such as a number, letter, unique color or other unique identification to coincide with a corresponding visible indication for each tube to assure that each rail is positioned within its corresponding tube.

The shim-supporting rails can be removed from the tubes to restore the supermagnet to its "factory condition" in which the unit generates an electromagnetic field substantially free of impurity gradients so long as there are no interfering magnetic material masses in proximity to the supermagnet. The supermagnet then is available to be moved to another location, for example, in an open field free of interfering magnetic material masses which cause impurity gradients. When the mobile unit is returned to its original location, the rails can be reinserted into the tubes and the MRI unit is instantly ready for continued operation at the original location.

Multiple tubes may be provided for receiving specific rails to respond to other locations where the mobile unit may be operated.

The hollow core of the tubular supermagnet contains a platform for supporting a patient. The mobile MRI unit is equipped with a shroud extending from the perimeter of the housing to the generally circular opening of the supermagnet core. In a preferred embodiment of the invention, openings are cut into the shroud in alignment with each of the positioned nonmagnetic tubes so that the shim supporting rods containing the magnetic material masses can be introduced into and withdrawn from the tubes without requiring removal of the shroud and without requiring entry of working personnel into the annular space between the cylinrical casing of the supermagnet and the housing. In a further preferred embodiment, such holes are covered with arcuate, aesthetically attractive flat shields which are visually compatible with the shroud. In a further preferred embodiment, the flat shields are secured to the shroud by locat-

DESCRIPTION OF THE DRAWINGS

FIG. 3 is an outline illustration of a tubular supermagnet for a magnetic resonance imaging installation illustrating schematically the ideal configuration of an electromagnetic field.

FIG. 4 is a perspective illustration of a tubular supermagnet having multiple shimming tubes according to the present invention.

FIG. 5 is a perspective illustration of a typical shimming tube of this invention.

FIG. 6 is a sectional illustration taken through a supermagnet casing illustrating multiple shimming tubes according to this invention.

FIG. 7 is a fragmentary perspective illustration showing an open end of a shimming tube and a shim supporting rail.

DESCRIPTION OF THE PREFERRED EMBODIMENTS

Figure 1:
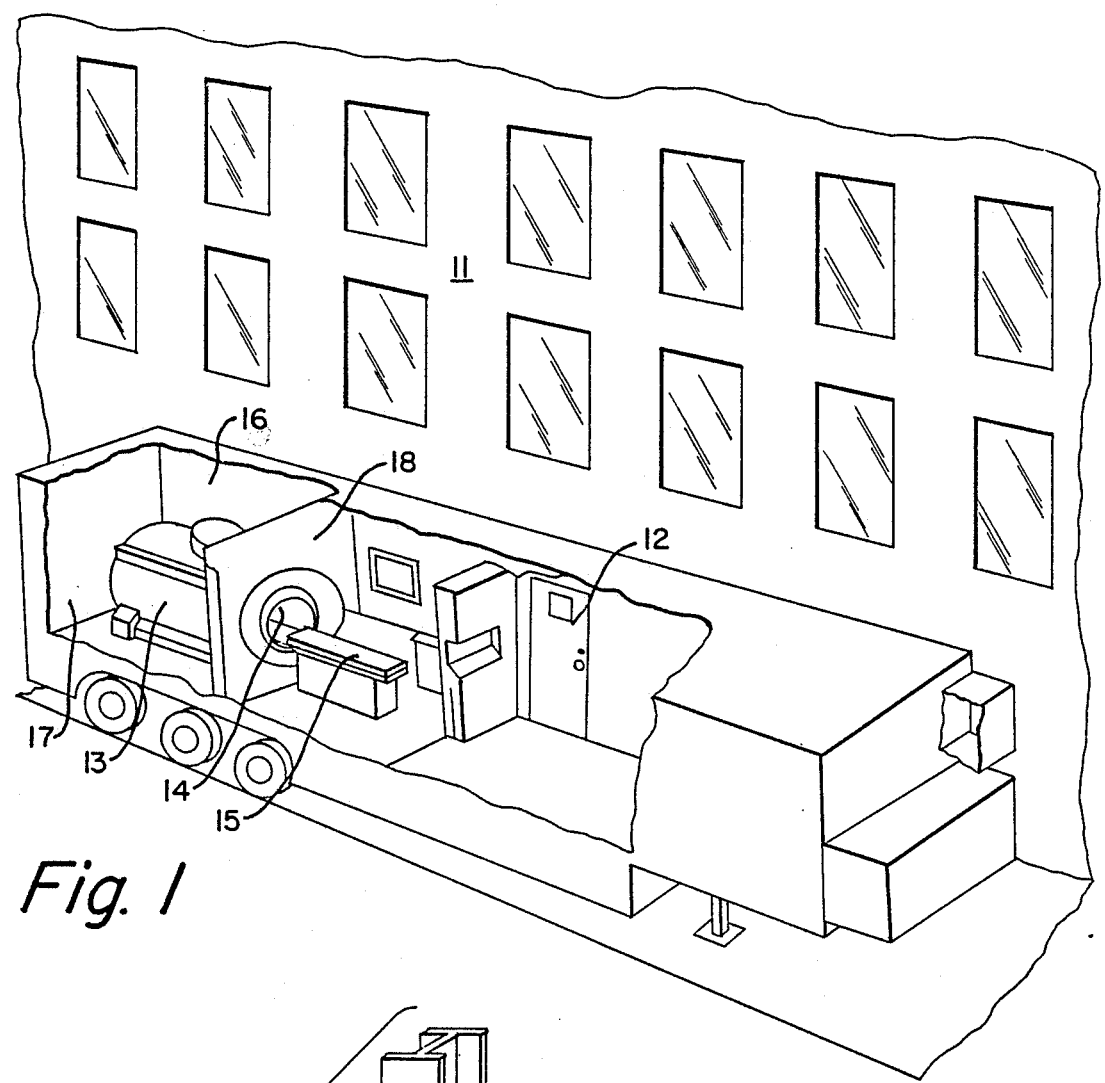
FIG. 1 is a prospective illustration of an mobile MRI unit adjoining an existing building.

FIG. 1 illustrates a mobile MRI unit mounted on a trailer 10 adjacent to a building 11 with a connecting door 12 permitting entry into the trailer 10 from the building 11. Within the trailer 10 is a tubular supermagnet contained within a cylindrical casing 13 and having an open end 14 for receiving as patient on a table 15 which can be advanced into the core of the supermagnet. The cylindrical casing 13 is mounted within a housing 16 which defines an annular space 17 between the cylindrical casing 13 and the housing 16. A shroud 18 is provided to cover the annular space outside of the open end 14.

When the MRI unit is in operation, a patient is positioned on the table 15 and is advanced through the open end 14 into the core of the tubular supermagnet. Typically the supermagnet has length of about eight feet and an inner core diameter of about 30 inches. The outer diameter of the supermagnet casing is about six feet.

Figure 2:
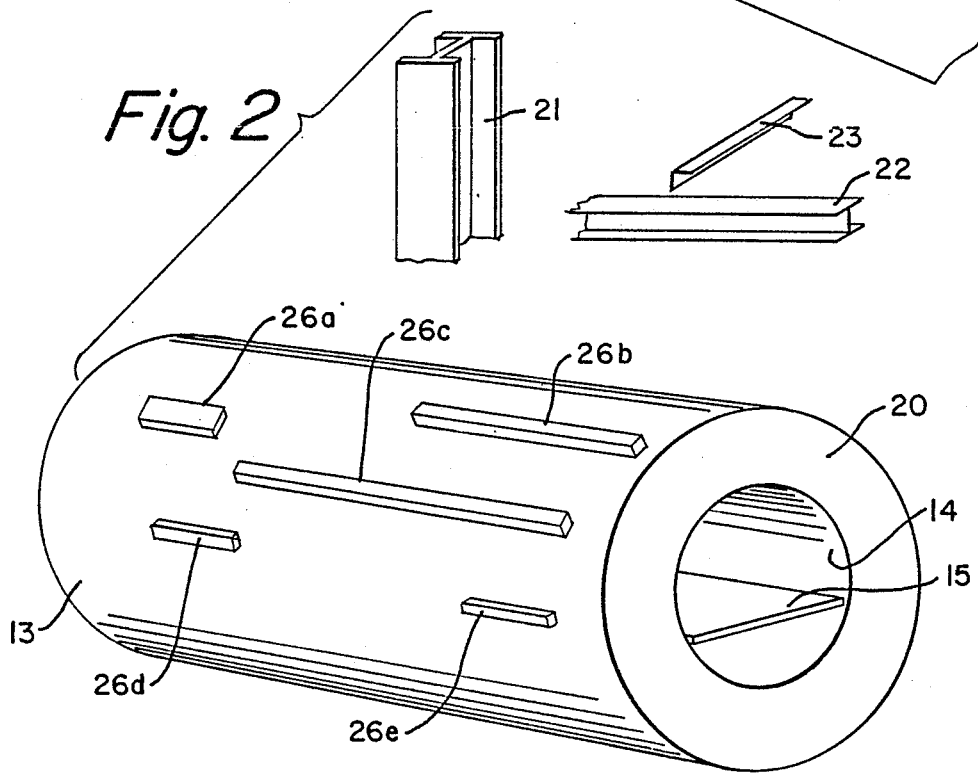
FIG. 2 is a perspective illustration of a tubular supermagnet casing, typical interfering magnetic elements and typical correcting shims.

The building 11 customarily will have significant quantities of steel which is a magnetic material in the form of columns, girder and beams. The presence of significant quantities of magnetic materials in proximity to the supermagnet creates impurity gradients which prevent development of a uniform electromagnetic field. In FIG. 2, the tubular supermagnet 20 with the casing 13 is influenced by the presence of columns 21, beams 22 and girders 23. The preferred electromagnetic force field is illustrated in FIG. 3 wherein the supermagnet 20 develops a dog-bone shape cross-section electromagnetic field 25 which is substantially uniform. According to the state-of-the-art practices, appropriate magnetic material masses 26a, 26b, 26c, 26d, 26e, referred to as "shims", are secured to the cylindrical outer surface of the casing 13 to compensate for the presence of the columns 21, beams 22, girders 23 and other nearby magnetic materials which might create impurity gradients and interfere with the uniformity of the magnetic field 25. Determining the size and desired location of the shims 26 is a time-consuming exercise requiring skilled technicians and also requiring technicians who must enter into the annular space 17 between the casing 13 and the housing 16 (FIG. 1) in order to secure the shims 26 at their intended locations. After the appropriate shims 26 have been applied, the required uniformity of electromagnetic field is achieved and the MRI unit is ready for use. So long as the MRI unit remains in the same location and so long as the interfering elements such as columns 21, beams 22 and girders 23 are unchanged, the MRI unit should function effectively.

However because of the high initial cost and operating expense of MRI installations it is desirable that the mobile unit 10 be transported to other locations to serve other users. The interfering magnetic materials at a new location will require a unique shimming calibration which is distinct from the shimming calibration carried out for the MRI unit at the previous location. For example, if the MRI unit is to be operated in an open field where there are no interfering steel structures, then all of the shims 26 should be removed so that the unit will function as designed. If the shims are removed, their location can be appropriately marked and they can be refastened when the MRI unit is returned to its original location. However refastening the shims requires entry of a skilled technician into the annular space 17 and is a time-consuming and undesirable assignment.

Figure 8:
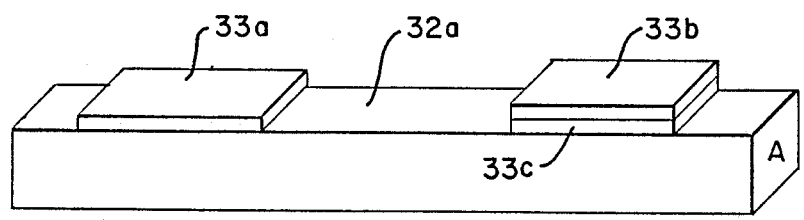
FIGS. 8, 9 and 10 are illustrations of shim supporting rails with different magnetic material mass configurations.

According to the present invention as illustrated in FIG. 4, the casing 13 of a tubular supermagnet is provided with plural non-magnetic tubes 30 having their lengthwise axes aligned with the central longitudinal axis 31 of the supermagnet. Each tube 30 is fabricated from non-metallic materials such as aluminum, extruded plastics or fiber-reinforced plastics. The tubes 30 are secured to the cylindrical casing 13 preferably by adhesives such as epoxy adhesives. The tubes 30 are positioned around the periphery of the cylindrical surface 13 as required, as illustrated in FIG. 6. Each individual tube 30 receives a shim supporting rail 32 which corresponds in shape to the shape of the tube 30. The shim supporting rails preferably are wooden rails although plastic rails or non-magnetic metal rails such as aluminum may be employed. Secured to the rails 32a, 32b, 32c are masses 33 of magnetic material, normally steel. In FIG. 8, the rail 32a has magnetic material in the form of a steel plate 33a and in the form of two steel plates 33b, 33c. The steel plate 33a is secured to the rail 32a by means of adhesive. The steel plate 33c is secured to the rail 32 by adhesive; and the steel plate 33b is secured to the steel plate 33c by means of an adhesive. The steel plates 33a, 33b, 33c alternatively could be secured by means of adhesive tapes, wires or other means.

Figure 9:
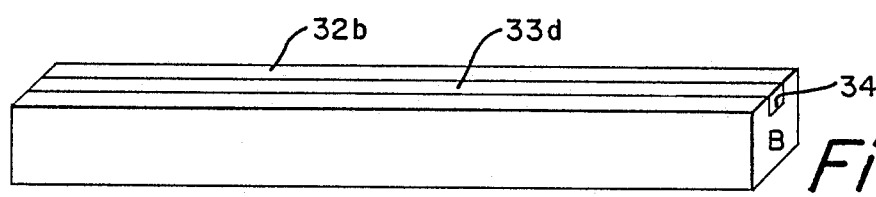

In FIG. 9, the non-magnetic rail 32b has a groove 34 running lengthwise to receive a mass of magnetic material in the form of a steel bar 33d. By providing the groove 34, the steel bar 33d may be recessed entirely beneath the surface of the rail 32b.

Figure 10:
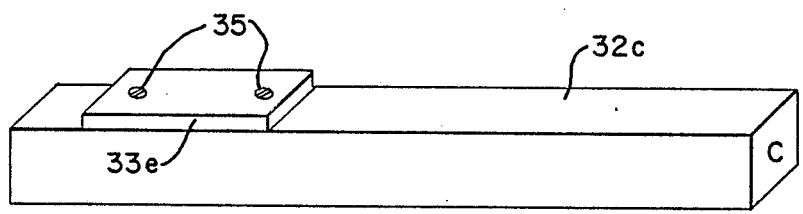

In FIG. 10 the non-magnetic rail 32c has a magnetic material mass in the form of a steel plate 33e which is secured by screws 35. Preferably the screws 35 or other fasteners are non-magnetic.

Typical sizes for the non-magnetic tubes 30 are approximately 6 to 8 feet in length and approximately 1 to 3 inches square. These dimensions permit an operator to introduce and remove the rails 32 singlehandedly. Each tube 30 (FIG. 5) may be deformed by a dent 36 which functions as a stop-means to locate the end of a rail within the tube. Alternative stop-means include a secured block of wood, plastic or other non-magnetic substance or any other cross-section obstruction such as a bolt, a rod, a bracket.

Figure 11:
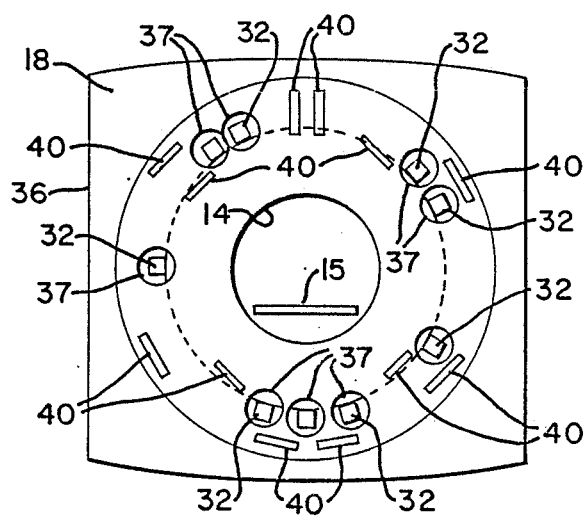
FIG. 11 is a front view of an MRI unit illustrating a shroud which hides the supermagnet and its surrounding annular regions except for the core opening.
Figure 12:
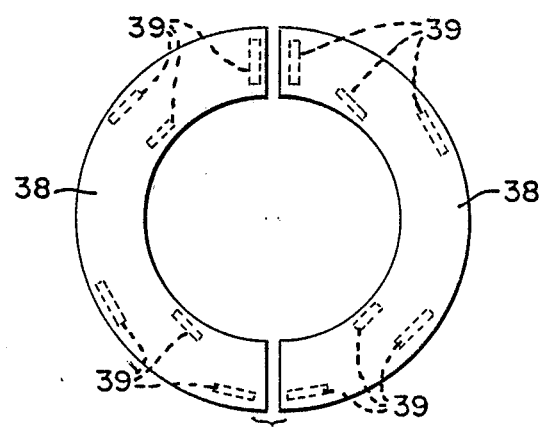
FIG. 12 is a plan view of typical arcuate flat shields.

As shown in FIG. 11, the shroud 18 extends from an outer perimeter 36 to the open end 14 and normally is formed from a rigid plastic vacuum molding. The shroud 18 provides an aesthetically attractive wall surface which hides from view the supermagnet and the annular space 17 between the casing 13 and the housing 16 (FIG. 1). In order to accommodate rapid introduction and removal of the shims, a number of holes 37 are cut into the shroud 18 in alignment with each of the tubes 30. The holes 37 are of sufficient size to permit the shim supporting rails 32 to be introduced into and removed from the tubes 30 by passing through the holes 37. In order to restore the aesthetic appearance of the shroud, appropriate arcuate flat shields 38 are provided as shown in FIG. 12. The flat shields 38 are adapted to be mounted over the locus of the holes 37 to cover the holes and serve as a visually attractive restoration of the appearance of the shroud 18. One preferred means for removably attaching the arcuate flat shields 38 is to provide Velcro (TM) strips 39 in correspondence with similar Velcro (TM) strips 40 which are secured to the shroud 18.

I claim:

1. In a magnetic resonance imaging installation including a cylindrical casing containing a tubular supermagnet, improved shimming means for the electromagnetic field of said supermagnet comprising:

plural tubes formed from non-magnetic structural material secured to the said casing with the lengthwise axis of the said tubes being generally parallel to the longitudinal axis of the said tubular supermagnet, each said tube being open at at least one end, plural shim supporting rails, each formed from a nonmagnetic structural material, at least one magnetic material mass secured to each of said shim supporting rails, each said shim supporting rail being adapted to enter one of said plural tubes, the said magnetic material mass on each rail being of appropriate size and weight to function as a magnetic field shim for the said supermagnet in its existing location, said shim supporting rails being insertable into and removable from the said tubes through said open end.

2. The improved shimming means of claim 1 wherein the said plural tubes are rectangular cross-section aluminum tubes.

3. The improved shimming means of claim 1 wherein the said plural tubes are fabricated from extruded plastics or fiber reinforced plastics, free of magnetic metal components.

4. The improved shimming means of claim 1 wherein the said shim supporting rails are wood rails having a cross-section corresponding to the cross-section of said plural tubes.

5. The improved shimming means of claim 1 wherein the said magnetic material mass is secured to the said shim supporting rail by means of an adhesive.

6. The improved shimming means of claim 1 wherein the said magnetic material mass is secured to the said shim supporting rail by means of fasteners.

7. The improved shimming means of claim 1 wherein the said magnetic material mass is secured to the said shim supporting rail by means of tape, cord or wire.

8. The improved shimming means of claim 1 wherein the said magnetic material mass is provided as a rod or strap and an appropriate lengthwise groove in the said shim supporting rail is provided to receive the said magnetic material mass.

9. The improved shimming means of claim 1 wherein the said cylindrical casing is mounted within a larger housing and wherein a shroud is provided between the housing and the inner diameter opening of the said tubular supermagnet, holes in the said shroud corresponding to each of the said plural tubes for introducing said shim supporting rails through the said shroud and into the said tubes while the said shroud remains in place.

10. The improved shimming means of claim 9 including at least one decorative cover arcuate flat shield to provide an aesthetic appearance to the shroud by covering the said holes.

11. The improved shimming means of claim 10 in which Velcro (TM) tapes are provided at spaced locations on the shroud surface and on the shroud-confronting surface of the said arcuate flat shield for mounting and removing the said arcuate flat shield.

12. The method of calibrating a magnetic resonance imaging installation which includes a tubular supermagnet contained within a housing by positioning appropriate quantities of magnetic material masses on the said housing at locations to compensate discontinuities or irregularities in the electromagnetic field of said supermagnet comprising:

(1) positioning appropriate magnetic material masses on at least one non-magnetic rail;
(2) securing to the said housing a non-magnetic tube having its lengthwise axis generally parallel to the longitudinal axis of said supermagnet;
(3) inserting the said rail into the said tube so that the said magnetic material masses are properly positioned with respect to the said housing to function as a shim for the electromagnetic field of said supermagnet;

repeating steps (1, 2 and 3) until the said electromagnetic field is substantially uniform.

* * * * *